United States Patent
Lee et al.

(10) Patent No.: US 9,972,502 B2
(45) Date of Patent: May 15, 2018

(54) SYSTEMS AND METHODS FOR PERFORMING IN-SITU DEPOSITION OF SIDEWALL IMAGE TRANSFER SPACERS

(71) Applicant: LAM RESEARCH CORPORATION, Fremont, CA (US)

(72) Inventors: Jae Ho Lee, Dublin, CA (US); Changwoo Lee, Rexford, NY (US); Phil Friddle, Clifton Park, NY (US); Stefan Schmitz, Malta, NY (US); Naveed Ansari, Fremont, CA (US); Michael Goss, Holliston, MA (US); Noel Sun, Sunnyvale, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 31 days.

(21) Appl. No.: 14/851,768

(22) Filed: Sep. 11, 2015

(65) Prior Publication Data
US 2017/0076957 A1    Mar. 16, 2017

(51) Int. Cl.
*H01L 21/311* (2006.01)
*H01L 21/302* (2006.01)
(Continued)

(52) U.S. Cl.
CPC .. *H01L 21/31144* (2013.01); *H01J 37/32366* (2013.01); *H01L 21/02211* (2013.01);
(Continued)

(58) Field of Classification Search
None
See application file for complete search history.

(56) References Cited

U.S. PATENT DOCUMENTS

| 7,265,013 B2 | 9/2007 | Furukawa et al. |
| 2013/0135058 A1 | 5/2013 | Long et al. |

(Continued)

OTHER PUBLICATIONS

Basker, V.S., etc., "A 0.063 μm² FinFET SRAM cell demonstration with conventional lithography using a novel integration scheme with aggressively scaled fin and gate pitch," IBM Research, Globalfoundreis, Inc., Toshiba America Electronic Components Inc., NEC Electronics, 2 pages.

*Primary Examiner* — Stephanie P Duclair

(57) ABSTRACT

A method of performing a sidewall image transfer (SIT) process includes arranging a substrate within a substrate processing chamber, wherein the substrate includes a mandrel layer formed on the substrate and etching the mandrel layer to form a plurality of mandrels. The method further includes, without removing the substrate from within the substrate processing chamber and subsequent to etching the mandrel layer, depositing a thin spacer layer such that the thin spacer layer is formed on upper surfaces of the plurality of mandrels, sidewalls of the plurality of mandrels, and portions of the substrate between the sidewalls of the plurality of mandrels, subsequent to depositing the thin spacer layer, etching the thin spacer layer to remove the thin spacer layer from the upper surfaces of the mandrels and the portions of the substrate between the sidewalls of the plurality of mandrels such that only the thin spacer layer formed on the sidewalls of the plurality of mandrels remains, and, subsequent to etching the thin spacer layer from the upper surfaces of the mandrels and the portions of the substrate between the sidewalls of the plurality of mandrels, etching the plurality of mandrels to remove the plurality of mandrels from the substrate such that only the thin spacer layer formed on the sidewalls of the plurality of mandrels remains on the substrate.

9 Claims, 4 Drawing Sheets

(51) Int. Cl.

| | |
|---|---|
| *H01L 21/461* | (2006.01) |
| *B44C 1/22* | (2006.01) |
| *C03C 15/00* | (2006.01) |
| *C03C 25/68* | (2006.01) |
| *C23F 1/00* | (2006.01) |
| *H01L 21/033* | (2006.01) |
| *H01L 21/02* | (2006.01) |
| *H01L 21/283* | (2006.01) |
| *H01J 37/32* | (2006.01) |
| *H01L 21/308* | (2006.01) |
| *H01L 21/28* | (2006.01) |

(52) U.S. Cl.
CPC .... *H01L 21/02271* (2013.01); *H01L 21/0332* (2013.01); *H01L 21/0334* (2013.01); *H01L 21/0337* (2013.01); *H01L 21/283* (2013.01); *H01L 21/28132* (2013.01); *H01L 21/28141* (2013.01); *H01L 21/3086* (2013.01); *H01L 21/31116* (2013.01); *H01J 2237/334* (2013.01)

(56) References Cited

U.S. PATENT DOCUMENTS

| | | | |
|---|---|---|---|
| 2013/0244437 A1* | 9/2013 | Flachowsky | H01L 21/3086 438/703 |
| 2013/0306598 A1* | 11/2013 | Ko | G03F 7/36 216/67 |
| 2014/0357084 A1* | 12/2014 | Ko | H01L 21/0337 438/696 |
| 2015/0035064 A1 | 2/2015 | Cheng et al. | |
| 2015/0087154 A1 | 3/2015 | Guha et al. | |

\* cited by examiner

SYSTEMS AND METHODS FOR PERFORMING IN-SITU DEPOSITION OF SIDEWALL IMAGE TRANSFER SPACERS

FIELD

The present disclosure relates to substrate processing systems, and more particularly to systems and methods for performing in-situ deposition of sidewall image transfer spacers.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Sidewall image transfer (SIT) is commonly used to form structures having high density patterns at sublithographic critical dimensions (CD) and pitches. During a SIT process, a mandrel layer is formed on a substrate such as a semiconductor wafer. The mandrel layer is lithographically patterned and etched to form a plurality of mandrels. A relatively thin conformal spacer layer is deposited over the mandrels. The conformal spacer layer is anisotropically etched to remove portions on upper surfaces of the mandrels and areas between the mandrels. Portions of the spacer layer formed on sidewalls of the mandrels are not fully etched. The mandrels are then selectively etched, leaving the sidewall spacers on the substrate. Because the sidewalls are formed when depositing the relatively thin conformal spacer layer, the sidewalls have a smaller CD and pitch than can be achieved by lithography alone. If the pitch and the CD of the mandrel are properly matched to the spacer thickness, the pitch of the structure formed via SIT is half of the lithographic mandrel pitch.

SUMMARY

A method of performing a sidewall image transfer (SIT) process includes arranging a substrate within a substrate processing chamber, wherein the substrate includes a mandrel layer formed on the substrate and etching the mandrel layer to form a plurality of mandrels. The method further includes, without removing the substrate from within the substrate processing chamber and subsequent to etching the mandrel layer, depositing a thin spacer layer such that the thin spacer layer is formed on upper surfaces of the plurality of mandrels, sidewalls of the plurality of mandrels, and portions of the substrate between the sidewalls of the plurality of mandrels, subsequent to depositing the thin spacer layer, etching the thin spacer layer to remove the thin spacer layer from the upper surfaces of the mandrels and the portions of the substrate between the sidewalls of the plurality of mandrels such that only the thin spacer layer formed on the sidewalls of the plurality of mandrels remains, and, subsequent to etching the thin spacer layer from the upper surfaces of the mandrels and the portions of the substrate between the sidewalls of the plurality of mandrels, etching the plurality of mandrels to remove the plurality of mandrels from the substrate such that only the thin spacer layer formed on the sidewalls of the plurality of mandrels remains on the substrate.

A system for performing a sidewall image transfer (SIT) process includes a substrate processing chamber including a substrate and a controller. The substrate includes a mandrel layer formed on the substrate. The controller is configured to control the substrate processing chamber to etch the mandrel layer to form a plurality of mandrels, and, without removing the substrate from within the substrate processing chamber and subsequent to etching the mandrel layer, deposit a thin spacer layer such that the thin spacer layer is formed on upper surfaces of the plurality of mandrels, sidewalls of the plurality of mandrels, and portions of the substrate between the sidewalls of the plurality of mandrels, subsequent to depositing the thin spacer layer, etch the thin spacer layer to remove the thin spacer layer from the upper surfaces of the mandrels and the portions of the substrate between the sidewalls of the plurality of mandrels such that only the thin spacer layer formed on the sidewalls of the plurality of mandrels remains, and, subsequent to etching the thin spacer layer from the upper surfaces of the mandrels and the portions of the substrate between the sidewalls of the plurality of mandrels, etch the plurality of mandrels to remove the plurality of mandrels from the substrate such that only the thin spacer layer formed on the sidewalls of the plurality of mandrels remains on the substrate.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

In a sidewall image transfer (SIT) process, a substrate including a lithographically defined mandrel layer is arranged in a processing chamber of an etch tool. The mandrel layer is patterned and etched to form a plurality of mandrels on the substrate. The substrate is then transferred to a processing chamber of a deposition tool to deposit a thin spacer layer over the mandrels.

In the deposition tool, a thin spacer layer is conformally deposited over the individual mandrels. The substrate is then removed from the deposition tool and returned to the processing chamber of the etch tool to remove portions of the spacer layer on upper surfaces of the mandrels and areas between the mandrels. The spacers formed on the sidewalls of the mandrels are not fully etched. The mandrels are then removed, which leaves only the sidewall spacers on the substrate.

Transferring the substrate between the processing chambers of the etch tool and the deposition tool requires various additional transfer steps, exposure of the etched substrate to non-vacuum conditions, and associated delays between processing steps.

In SIT systems and methods according to the present disclosure (including, but not limited to, SIT, double SIT or SIT2, quadruple SIT, octa-ruple SIT, etc.), deposition of the thin spacer layer on the mandrels is performed in the same tool that performed the etching of the mandrels. Deposition of the thin spacer layer is performed in-situ without a vacuum break, in the same chamber and using the same tool as the previous etching step. Accordingly, steps associated with the transfer of the etched substrate from the etch tool to an ex-situ deposition tool and from the deposition tool back to the etch tool can be omitted.

Figure 1A:
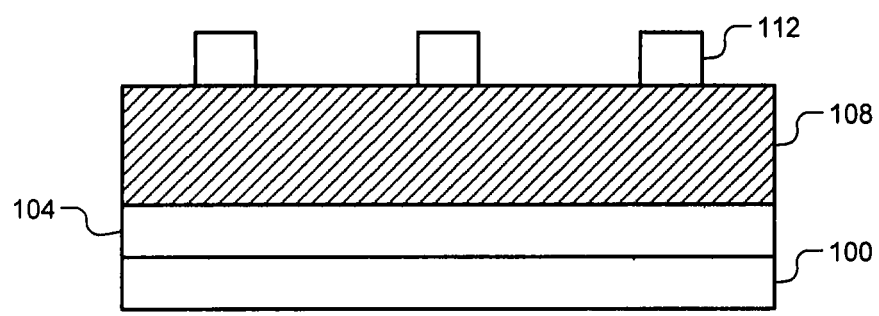
FIGS. 1A through 1E illustrate an example in-situ thin spacer layer deposition for a sidewall image transfer process according to the present disclosure.

Referring now to FIGS. 1A-1E, in-situ thin spacer layer deposition for an SIT process according to the principles of the present disclosure is described. FIG. 1A shows a substrate 100 including, for example, a hardmask layer 104 formed thereon. For example only, the substrate 100 includes a silicon (Si) substrate and the hardmask layer 104 is made of a silicon nitride ($Si_3N_4$), although other materials may be used. A mandrel layer 108 is deposited on the hardmask layer 104 (e.g., using chemical vapor deposition, or CVD). For example only, the mandrel layer 108 may include amorphous silicon (a-Si). In some examples, the mandrel layer 108 may have a height of approximately 50-150 nm (e.g., 100 nm). A patterning layer is formed on the mandrel layer 108 and patterned using photolithography. The patterning layer corresponds to, for example, a patterned photoresist layer or mask 112.

Figure 1B:
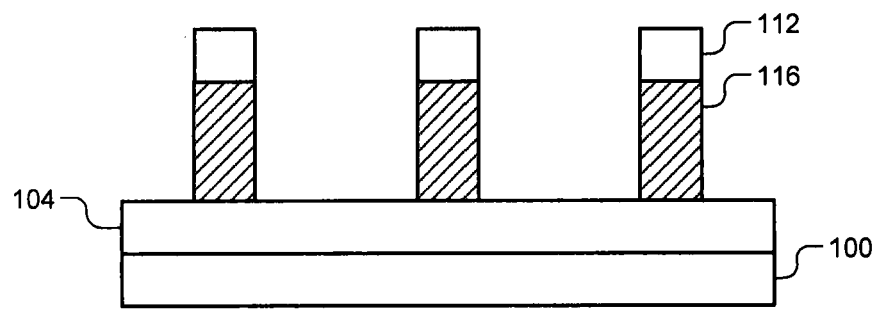

The substrate 100 including the hardmask layer 104, the mandrel layer 108, and the mask 112 is arranged within a plasma chamber (e.g., an inductively coupled plasma chamber) of an etch tool. For example only, the etch tool may be a Kiyo plasma etching system manufactured by Lam Research Corporation of Fremont, Calif. As shown in FIG. 1B, the mandrel layer 108 is etched (e.g., using an anisotropic etch or other process) within the plasma chamber of the etch tool to form a plurality of mandrels 116. The mask 112 protects the portions of the mandrel layer 108 corresponding to the mandrels 116 during the etching of the mandrel layer 108. If the mask 112 is a photoresist mask, the mask 112 can be removed with an oxygen containing plasma. If the mask 112 is of a material similar to a spacer layer as described below, the mask 112 may remain on the mandrels 116 and may be etched during the etching of the spacer layer.

Figure 1C:
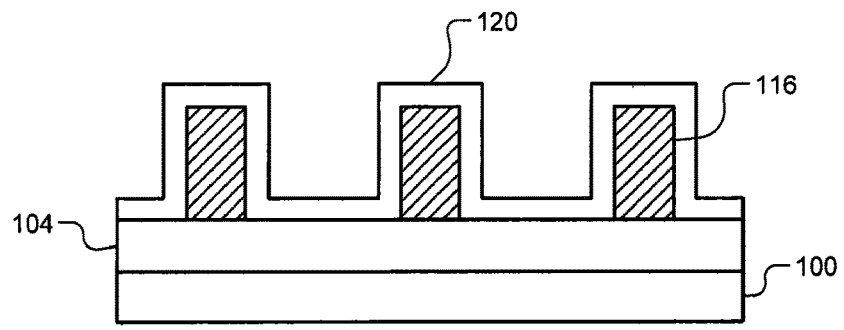

In FIG. 1C, with the substrate 100 still arranged within the plasma chamber of the etch tool (i.e., with the substrate 100 in-situ), a spacer layer 120 is deposited over the substrate 100 (i.e., on the hardmask layer 104 formed on the substrate 100) and the mandrels 116. For example only, the spacer layer 120 may be conformally deposited using an oxide-type deposition (using precursors including silicon tetrachloride ($SiCl_4$), silane ($SiH_4$), etc.), a nitride-type deposition (using precursors including molecular nitrogen, ammonia ($NH_3$), etc.), and/or a carbon based deposition (using precursors including methane ($CH_4$), fluoromethane ($CH_3F$), etc.).

In one example, the spacer layer 120 is deposited using a $SiCl_4$ precursor in the presence of $O_2$. Other example process parameters for performing the deposition of the spacer layer 120 include temperature variation between a minimum temperature less than 10° C. up to 120° C., plasma power between 200 and 1800 W, a bias voltage from 0 to approximately 1000 volts, and a chamber pressure between 2 mTorr to 2000 mTorr.

Figure 1D:
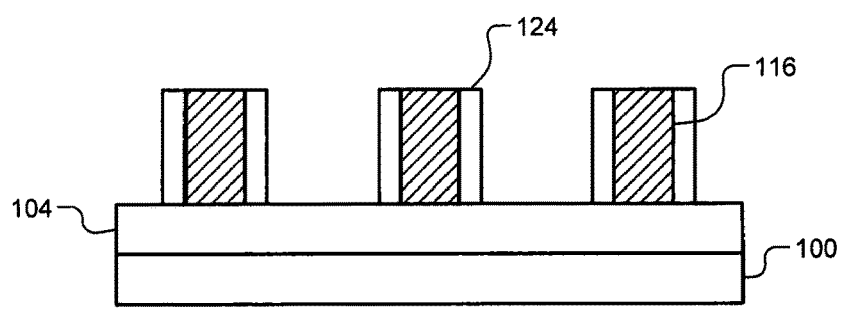
Figure 1E:
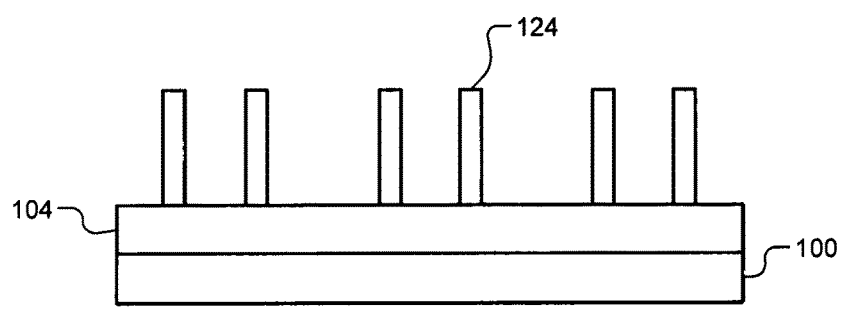

In FIG. 1D, the spacer layer 120 is etched (e.g., using an anisotropic etch process) to remove portions of the spacer layer 120 from the upper surfaces of the substrate 100 and the mandrels 116 while allowing sidewall portions 124 of the spacer layer 120 to remain. In some examples (e.g., when the mandrels 116 are formed using certain materials), a breakthrough step may be performed (e.g., a fluoride containing plasma treatment) subsequent to the etch described in FIG. 1D. Further, depending on the material of the spacer layer 120, an oxygen-containing plasma treatment may be performed prior to the fluoride containing plasma treatment. In FIG. 1E, the mandrels 116 are removed (e.g., using an anisotropic etch). Accordingly, the sidewall portions 124 remain formed on the substrate 100. In some examples, subsequent to the etching described in FIG. 1E, the pattern may be transferred into the underlying layers (e.g., the hardmask layer 104 and/or the substrate 100).

Figure 2:
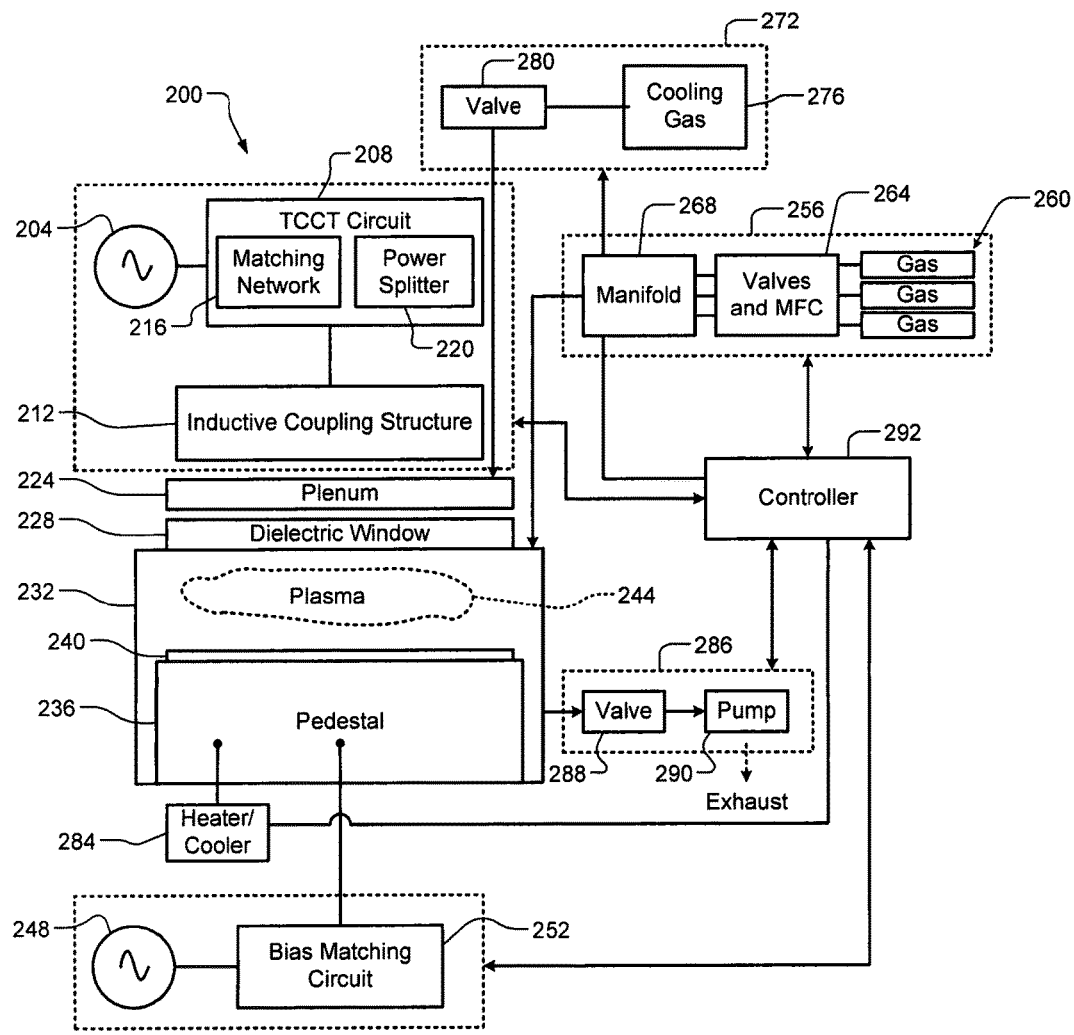
FIG. 2 is a functional block diagram of an example substrate processing system according to the present disclosure.

Referring now to FIG. 2, an example of a substrate processing system 200 that can be used to perform an in-situ SIT process according to the principles described in the present disclosure is shown. While the foregoing description relates to an inductively coupled plasma (ICP) system, other types of ICP systems or other plasma processing systems may be used. The substrate processing system 200 includes an RF source 204 connected to a transformer coupled capacitive tuning (TCCT) circuit 208, which outputs current to an inductive coil structure 212.

The TCCT circuit 208 typically includes a matching network 216 and a power splitter 220. The matching network 216 may be connected by a transmission line to the RF source 204. The matching network 216 matches an impedance of the RF source 204 to the rest of the circuit including the power splitter 220 and the inductive coil structure 212. An example of a TCCT circuit 208 is shown and described in commonly assigned U.S. Publication No. 2013/0135058 to Long et al., which is hereby incorporated by reference in its entirety. In some examples, the inductive coil structure 212 may include a single inductive coil, a pair of inductive coils, or an inner inductive coil pair and an outer inductive coil pair. The power splitter 220 may be used to control the relative amount of inductive current supplied to coils of the inductive coil structure 212. While flat coils are shown, other types of coils may be used.

A gas plenum 224 may be arranged between the inductive coil structure 212 and a dielectric window 228. The dielectric window 228 is arranged along one side of a processing chamber 232. The processing chamber 232 further comprises a pedestal 236 that supports a substrate 240. The pedestal 236 may include an electrostatic chuck, a mechanical chuck or other type of chuck. Plasma 244 is generated inside of the processing chamber 232. The plasma 244 may be used to deposit film or to etch the substrate 240. An RF source 248 and a bias matching circuit 252 may be used to bias the pedestal 236 during operation.

A gas delivery system 256 may be used to supply a gas mixture to the processing chamber 232 adjacent to the dielectric window 228. The gas delivery system 256 may include process gas sources 260, a metering system 264 such as valves and mass flow controllers, and a manifold 268 to mix the process gases.

A gas delivery system 272 may be used to deliver gas 276 via a valve 280 to the gas plenum 224. The gas may include cooling gas that is used to cool the inductive coil structure 212 and the dielectric window 228. A heater/cooler 284 may be used to heat the pedestal 236 to a predetermined temperature. An exhaust system 286 includes a valve 288 and pump 290 to remove reactants from the processing chamber 232 by purging or evacuation.

A controller 292 may be used to control both etching and deposition processes. The controller 292 monitors process parameters such as temperature, pressure, etc. and controls delivery of the gas mixture, striking, maintaining and extinguishing the plasma, removal of reactants, supply of cooling gas, etc.

With reference to FIGS. 1A through 1E and FIG. 2, the substrate processing system 200 according to the principles of the present disclosure is configured to perform both etching and deposition steps for an SIT process within the processing chamber 232 (e.g., each of the steps described in FIGS. 1A-1E). For example, the controller 292 controls parameters of various components of the substrate processing system 200 to etch the mandrels 116. Then, without removing the substrate 240 from the processing chamber 232 (i.e., with the substrate 240 in-situ), the controller 292 prepares the substrate processing system 200 for performing deposition of the spacer layer 120. For example, the controller 292 activates the exhaust system 286 to purge or evacuate reactants associated with etching the mandrels 116 from the processing chamber 232, controls the heater/cooler 284 to adjust the temperature in the processing chamber 232, adjusts the bias matching circuit 252 and/or the RF sources 204 and 248, adjusts the gas delivery systems 256 and 272 according to gases required during the deposition of the spacer layer 120, etc. When preparation of the processing chamber 232 is complete, the controller 292 controls the substrate processing system 200 to deposit the thin spacer layer 120. The thin spacer layer 120 and mandrels 116 can then be etched as described in FIGS. 1D and 1E.

Figure 3:
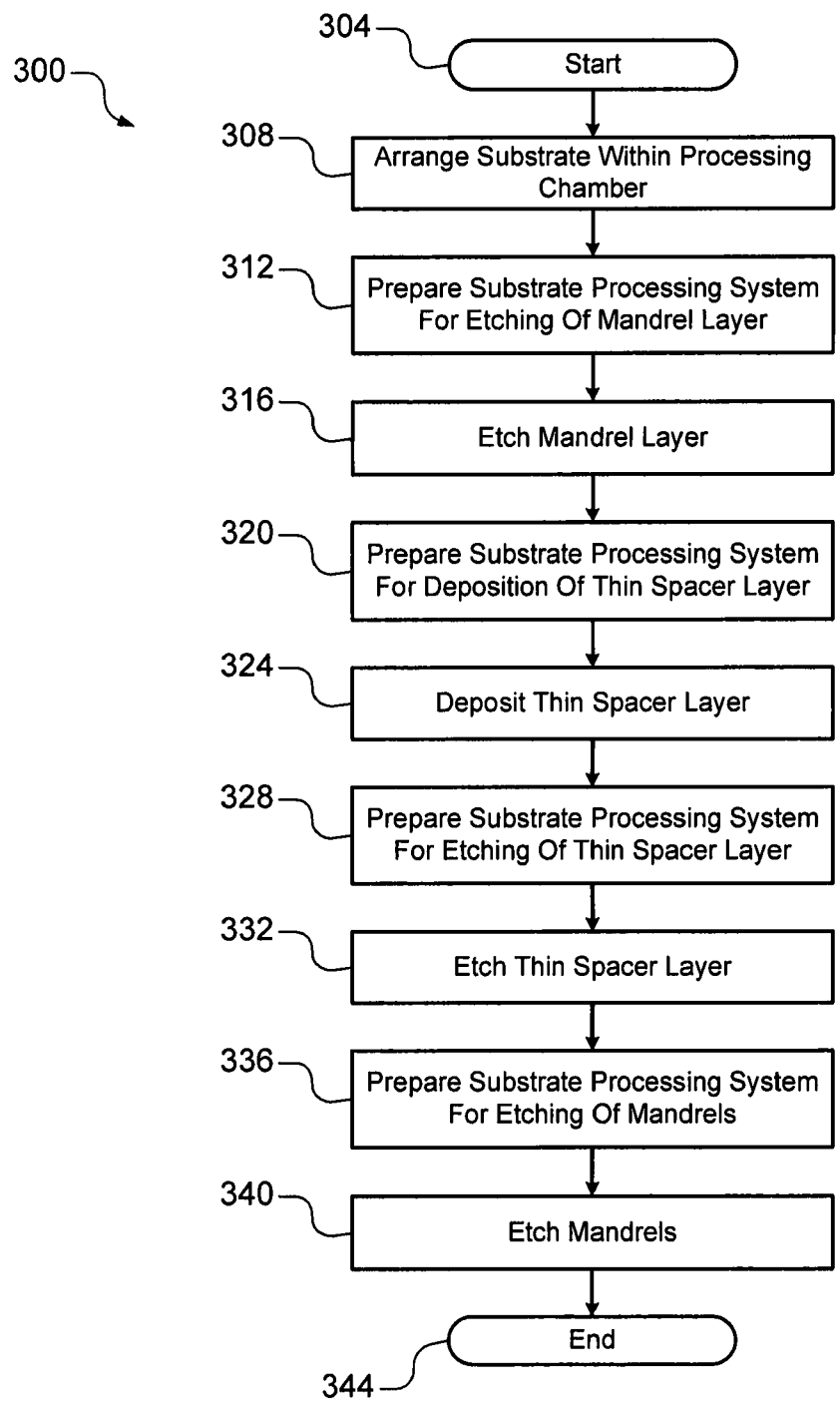
FIG. 3 is a flowchart illustrating an example in-situ thin spacer layer deposition method according to the present disclosure.

Referring now to FIG. 3, an example in-situ thin spacer layer deposition method 300 according to the principles of the present disclosure begins at 304. At 308, a substrate including, for example, a hardmask layer, a mandrel layer, and a mask as shown in FIG. 1A is arranged within a processing chamber of a substrate processing system. At 312, the substrate processing system is configured to etch the mandrel layer into a plurality of mandrels. For example, a controller (e.g., the controller 292 of FIG. 2) prepares the processing chamber (e.g., purges/evacuates gases) and changes operating parameters of various components of the substrate processing system. At 316, the method 300 anisotropically etches the mandrel layer to form the plurality of mandrels. For example, the controller controls components of the substrate processing system to etch the mandrel layer according to the operating parameters.

At 320, with the substrate including the plurality of mandrels still within the processing chamber, the substrate processing system is configured to deposit of a thin spacer layer on the plurality of mandrels. For example, the controller prepares the processing chamber and changes operating parameters of various components of the substrate processing system related to depositing the thin spacer layer. At 324, the method 300 conformally deposits the thin spacer layer on the plurality of mandrels. For example, the controller controls components of the substrate processing system to deposit the thin spacer layer according to the operating parameters.

At 328, the substrate processing system is configured to etch the thin spacer layer. For example, the controller prepares the processing chamber and changes operating parameters of various components of the substrate processing system related to etching the thin spacer layer. At 332, the method 300 anisotropically etches the thin spacer layer. For example, the controller controls components of the substrate processing system to etch the thin spacer layer according to the operating parameters.

At 336, the substrate processing system is configured to etch the plurality of mandrels. For example, the controller prepares the processing chamber and changes operating parameters of various components of the substrate processing system related to etching the plurality of mandrels. At 340, the method 300 etches the plurality of mandrels. For example, the controller controls components of the substrate processing system to etch the plurality of mandrels according to the operating parameters.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. As used herein, the phrase at least one of A, B, and C should be construed to mean a logical (A OR B OR C), using a non-exclusive logical OR, and should not be construed to mean "at least one of A, at least one of B, and at least one of C." It should be understood that one or more steps within a method may be executed in different order (or concurrently) without altering the principles of the present disclosure.

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a physical vapor deposition (PVD) chamber or module, a chemical vapor deposition (CVD) chamber or module, an atomic layer deposition (ALD) chamber or module, an atomic layer etch (ALE) chamber or module, any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A method of performing a sidewall image transfer (SIT) process, the method comprising:
    arranging a substrate within a substrate processing chamber, wherein the substrate includes a mandrel layer formed on the substrate; and
    without removing the substrate from within the substrate processing chamber:
        (i) etching the mandrel layer to form a plurality of mandrels;
        (ii) subsequent to etching the mandrel layer, depositing a thin spacer layer such that the thin spacer layer is formed on upper surfaces of the plurality of mandrels, sidewalls of the plurality of mandrels, and portions of the substrate between the sidewalls of the plurality of mandrels, wherein the substrate is not removed from within the substrate processing chamber between (i) and (ii);
        (iii) subsequent to depositing the thin spacer layer, etching the thin spacer layer to remove the thin spacer layer from the upper surfaces of the mandrels and the portions of the substrate between the sidewalls of the plurality of mandrels such that only the thin spacer layer formed on the sidewalls of the plurality of mandrels remains, wherein the substrate is not removed from within the substrate processing chamber between (ii) and (iii); and
        (iv) subsequent to etching the thin spacer layer from the upper surfaces of the mandrels and the portions of the substrate between the sidewalls of the plurality of mandrels, etching the plurality of mandrels to remove the plurality of mandrels from the substrate such that only the thin spacer layer formed on the sidewalls of the plurality of mandrels remains on the substrate, wherein the substrate is not removed from within the substrate processing chamber between (iii) and (iv).

2. The method of claim 1, wherein the substrate processing chamber corresponds to a plasma chamber of an etch tool.

3. The method of claim 1, wherein the substrate comprises silicon.

4. The method of claim 1, wherein the substrate includes a hardmask layer.

5. The method of claim 4, wherein the hardmask layer comprises silicon nitride (SiN).

6. The method of claim 1, wherein the mandrel layer comprises amorphous silicon.

7. The method of claim 1, wherein depositing the thin spacer layer includes depositing the thin spacer layer using at least one of oxide-type deposition, nitride-type deposition, and carbon based deposition.

8. The method of claim 1, wherein depositing the thin spacer layer includes depositing the thin spacer layer using a silicon tetrachloride ($SiCl_4$) precursor in the presence of oxygen.

9. The method of claim 1, further comprising, subsequent to etching the mandrel layer and prior to depositing the thin spacer layer, adjusting at least one parameter of the substrate processing chamber.

* * * * *